(12) United States Patent
Chen et al.

(10) Patent No.: US 6,348,401 B1
(45) Date of Patent: Feb. 19, 2002

(54) METHOD OF FABRICATING SOLDER BUMPS WITH HIGH COPLANARITY FOR FLIP-CHIP APPLICATION

(75) Inventors: Chih-Shun Chen, Kaohsiung; Chao-Dung Suo, Taichung; Jui-Meng Jao, Miaoli; Ke-Chuan Yang; Feng-Lung Chien, both of Taichung, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/709,908

(22) Filed: Nov. 10, 2000

(51) Int. Cl.$^7$ ............................................... H01L 21/44
(52) U.S. Cl. ...................................... 438/617; 438/614
(58) Field of Search ................................ 438/617, 612, 438/613, 614, 618, 622, 605; 257/779, 780, 781; 205/125; 361/761

(56) References Cited

U.S. PATENT DOCUMENTS

| | | | |
|---|---|---|---|
| 5,536,677 A | | 7/1996 | Hubacher ................... 437/183 |
| 6,013,572 A | * | 1/2000 | Hur et al. ................... 438/614 |
| 6,117,299 A | * | 12/2000 | Rinne et al. ................. 205/125 |

* cited by examiner

*Primary Examiner*—David Nelms
*Assistant Examiner*—Thao P. Le
(74) *Attorney, Agent, or Firm*—Peter F. Corless; Steven M. Jensen; Edwards & Angell, LLP

(57) ABSTRACT

A solder-pump fabrication method is proposed, which is used for the fabrication of solder bumps with high coplanarity over a semiconductor chip for flip-chip application. The proposed solder-bump fabrication method is characterized in the use of a two-step solder-bump fabrication process, including a first step of electroplating solder over UBM (Under Bump Metallization) pads to a controlled height still below the topmost surface of the mask, and a second step of screen-printing solder paste over the electroplated solder layer. The combined structure of the electroplated solder layer and the printed solder layer is then reflowed to form the desired solder bump. Since the proposed solder-bump fabrication method allows the solder material electroplated and printed over the UBM pads to be confined within the mask openings and never exceed the topmost surface of the mask, the resulted solder bumps would not be bridged to neighboring ones. Moreover, the proposed solder-bump fabrication method allows all the resulted solder bumps to be substantially equally sized to achieve high coplanarity.

9 Claims, 4 Drawing Sheets

US 6,348,401 B1

METHOD OF FABRICATING SOLDER BUMPS WITH HIGH COPLANARITY FOR FLIP-CHIP APPLICATION

BACKGROUND OF THE INVENTION

1. Field of the Invention

This invention relates to semiconductor packaging technology, and more particularly, to a solder-bump fabrication method for fabricating solder bumps with high coplanarity over a semiconductor chip for flip-chip application.

2. Description of Related Art

The flip-chip technology is an advanced semiconductor fabrication technology that allows the overall package size to be made very compact. The flip-chip package configuration differs from conventional ones particularly in that it mounts the semiconductor chip in an upside-down manner over the chip carrier and electrically coupled to the same by means of solder bumps provided on the active surface of the semiconductor chip. Since no bonding wires are required, which would otherwise occupy much layout space, the overall size of the flip-chip package can be made very compact as compared to conventional types of semiconductor device packages.

The attachment of solder bumps to a flip chip requires the provision of the so-called UBM (Under Bump Metallization) pads on the active surface of the semiconductor chip, which is wettable to the solder bumps so that the solder bumps can be securely attached to the flip chip. After the UBM structure is formed, a solder-bump fabrication process is performed to form a solder bump on each UBM pad. Conventionally, there are various techniques that can be used to implement the solder-bump fabrication process, including, for example, electroplating, screen printing, evaporation, and so on. One example of the utilization of electroplating technique for solder-bump fabrication is illustratively depicted in the following with reference to FIGS. 1A–1E.

Referring to FIG. 1A, in the flip-chip fabrication, the first step is to prepare a semi-conductor chip 100 having a plurality of bonding pads (only two are shown in FIG. 1A, respectively designated by the reference numerals 101, 102). Further, a passivation layer 110 is formed over the active surface of the semiconductor chip 100, and which is selectively removed to expose the bonding pads 101, 102. Next, an array of UBM pads (only two are shown in FIG. 1A, respectively designated by the reference numerals 121, 122) are formed respectively over the bonding pads 101, 102.

Referring further to FIG. 1B, the next step is to perform a solder-bump fabrication process, in which a mask 130, such as a dry-film mask, is first disposed over the passivation layer 110. The mask 130 is predefined with a plurality of openings (only two are shown in FIG. 2B, respectively designated by the reference numerals 131, 132) to exposed the UBM pads 121, 122.

Referring further to FIG. 1C, in the next step, a solder-electroplating process is performed to electroplate a selected solder material, such as Sn/Pb (tin/lead) alloy, through the mask openings 131, 132 onto the UBM pads 121, 122. As a result of this process, a first solder bump 141 is formed over the first UBM pad 121, while a second solder bump 142 is formed over the second UBM pad 122.

During the foregoing solder-electroplating process, however, the electroplating electrical current applied to the UBM pads 121, 122 may be undesirably inconsistent in amounts. Moreover, the electrolyte being used in the solder-electroplating process may be undesirably subjected to disturbances. These two factors would cause the resulted solder bumps 141, 142 to be formed with different volumes.

Assume the first UBM pad 121 receives a smaller amount of electroplating electrical current, whereas the second UBM pad 122 receives a larger amount of electroplating electrical current during the solder-electroplating process. In this case, the electroplating of solder over the second UBM pad 122 would be faster in rate than that over the first UBM pad 121. Consequently, as illustrated in FIG. 1C, as the solder-electroplating process is completed, the second solder bump 142 formed over the second UBM pad 122 would be larger in volume than the first solder bump 141 formed over the first UBM pad 121.

Moreover, the electroplated solder would extend beyond the topmost surface of the dry-film mask 130 and spread horizontally over the dry-film mask 130, rendering the resulted solder bumps 141, 142 into a mushroom-like shape that may likely make the neighboring solder bumps 141, 142 bridged to each other. If bridging occurs, the solder bumps 141, 142 would be nevertheless jointed together after reflow, making them short-circuited to each other.

Referring further to FIG. 1D, in the next step, the dry-film mask 130 is removed, leaving the first solder bump 141 over the first UBM pad 121 and the second solder bump 142 over the second UBM pad 122.

Referring further to FIG. 1E, in the next step, a solder-reflow process is performed to reflow the mushroom-like solder bumps 141, 142. After reflow, the solder bumps 141, 142 which become more rounded in shape.

However, as mentioned earlier, the second solder bump 142 formed over the second UBM pad 122 is larger in volume than the first solder bump 141 formed over the first UBM pad 121 due to a larger electroplating electrical current being applied to the second solder bump 142 and a smaller electroplating electrical current being applied to the first solder bump 141 during the solder-electroplating process. This would undesirably make the reflowed second solder bump 142 to be greater in height than the reflowed first solder bump 141, with a height difference of $\Delta H$, which is typically 100 $\mu m \pm 10$ $\mu m$ (micrometer), as illustrated in FIG. 1E. In other words, the resulted solder bumps 141, 142 would have poor coplanarity. The non-coplanarity in bump height would undesirably make the resulted flip-chip package distorted in construction.

One solution to the foregoing problem is disclosed in U.S. Pat. No. 5,536,677 entitled "METHOD OF FORMING CONDUCTIVE BUMPS ON A SEMICONDUCTOR DEVICE USING A DOUBLE MASK STRUCTURE", which is characterized in the use of a double mask structure to help allow the resulted solder bumps to have substantially the same volume and height for high coplanarity. One drawback to this patented technology, however, is that the use of double mask structure would make the overall fabrication considerably more complex to implement.

SUMMARY OF THE INVENTION

It is therefore an objective of this invention to provide a solder-bump fabrication method, which can help allow the fabricated solder bumps to have high coplanarity.

It is another objection of this invention to provide a solder-bump fabrication method, which can help allow the fabricated solder bump not to have a mushroom-like shape for prevention of short-circuiting between neighboring solder bumps.

In accordance with the foregoing and other objectives, the invention proposes a new solder-bump fabrication method.

Broadly defined, the solder-bump fabrication method of the invention comprises the following procedural steps: (1) forming an array of UBM pads over the semiconductor chip; (2) forming a mask over the semiconductor chip, the mask being predefined with a plurality of openings to expose the UBM pads; (3) performing a solder-electroplating process to electroplate a solder material through the mask openings onto the UBM pads until the topmost surface of the electroplated solder over the UBM pads reaches a predefined height below the topmost surface of the mask to thereby form an electroplated solder layer over each of the UBM pads; and (4) performing a screen-printing process to fill solder paste into the remaining void portions in each of the mask openings to thereby form a printed solder layer over each electroplated solder layer.

The foregoing solder-bump fabrication method is characterized in the use of a two-step solder-bump fabrication process, including a first step of electroplating solder over UBM pads to a controlled height still below the topmost surface of the dry-film mask, and a second step of screen-printing solder paste over the electroplated solder layer. Compared to the prior art, since the solder-bump fabrication method of the invention allows the solder material electroplated and printed over the UBM pads to be confined within the mask openings and never exceed the topmost surface of the mask, the resulted solder bumps would not be bridged to neighboring ones. Moreover, the solder-bump fabrication method of the invention allows all the resulted solder bumps to be substantially equally sized to achieve high coplanarity.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the solder-bump fabrication method according to the invention is disclosed in full details in the following with reference to FIGS. 2A–2F.

Figure 1A:
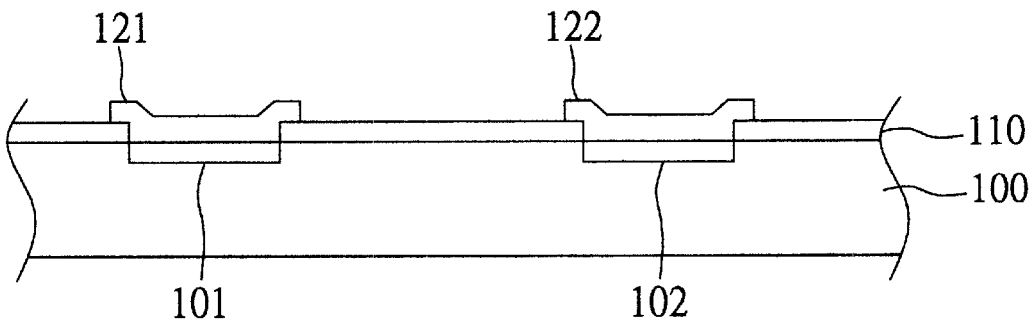
FIGS. 1A–1E (PRIOR ART) are schematic sectional diagrams used to depict the procedural steps involved in a conventional solder-bump fabrication method.
Figure 1B:
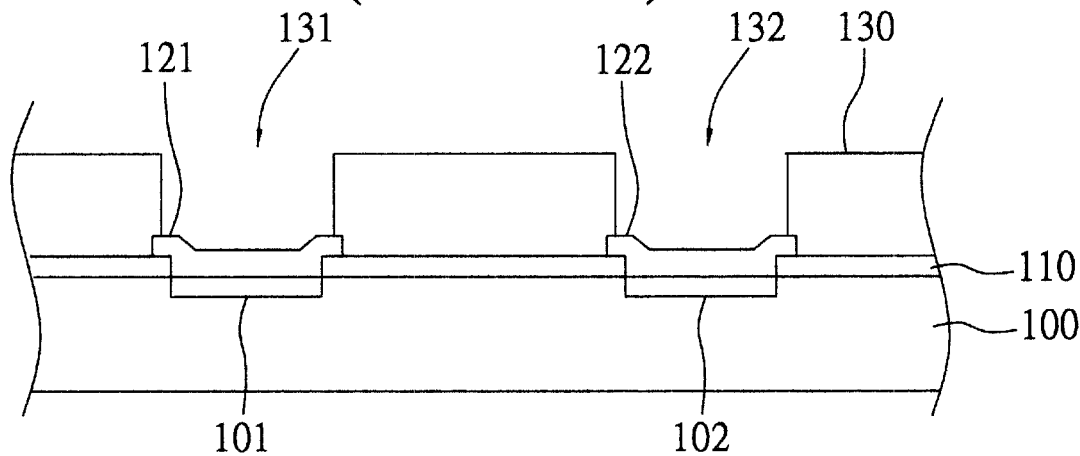
Figure 1C:
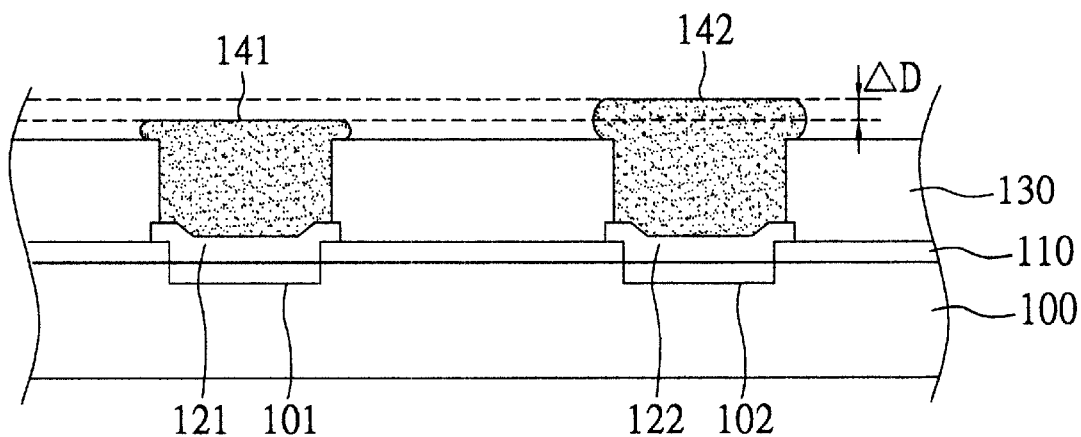
Figure 1D:
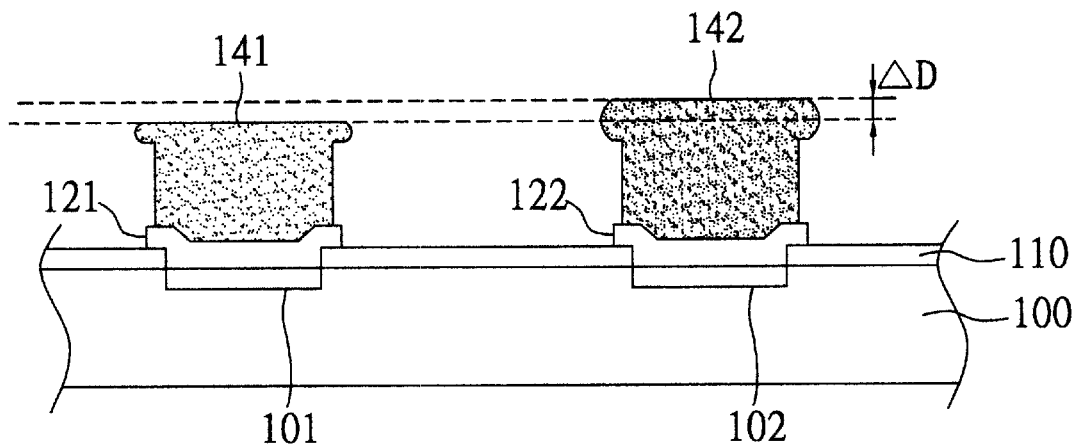
Figure 1E:
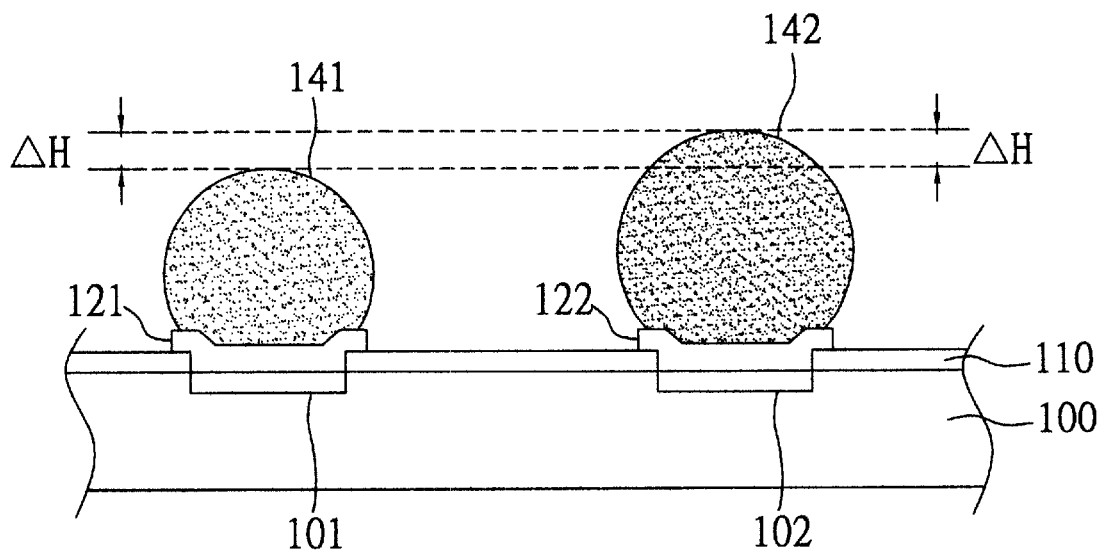
Figure 2A:
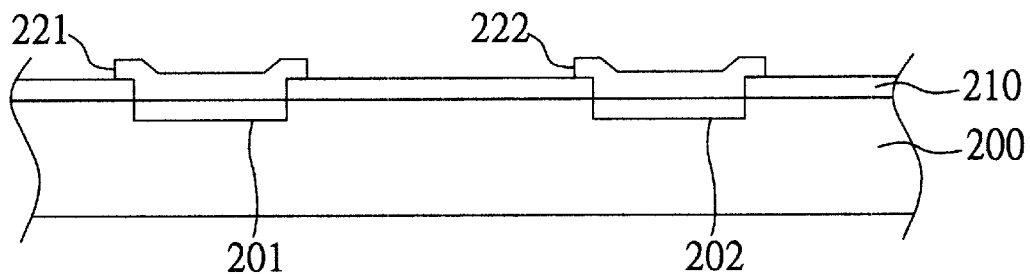
FIGS. 2A–2F are schematic sectional diagrams used to depict the procedural steps involved in the solder-bump fabrication method according to the invention.

Referring to FIG. 2A, in the flip-chip fabrication, the first step is to prepare a semi-conductor chip 200 having a plurality of bonding pads (only two are shown in FIG. 2A, respectively designated by the reference numerals 201, 202). Further, a passivation layer 210 is formed over the active surface of the semiconductor chip 200, and which is selectively removed to expose the bonding pads 201, 202. Next, an array of UBM pads (only two are shown in FIG. 2A, respectively designated by the reference numerals 221, 222) are formed respectively over the bonding pads 201, 202. The UBM fabrication utilizes a conventional technique and is not within the spirit and scope of the invention, so detailed steps thereof will not be further described.

Figure 2B:
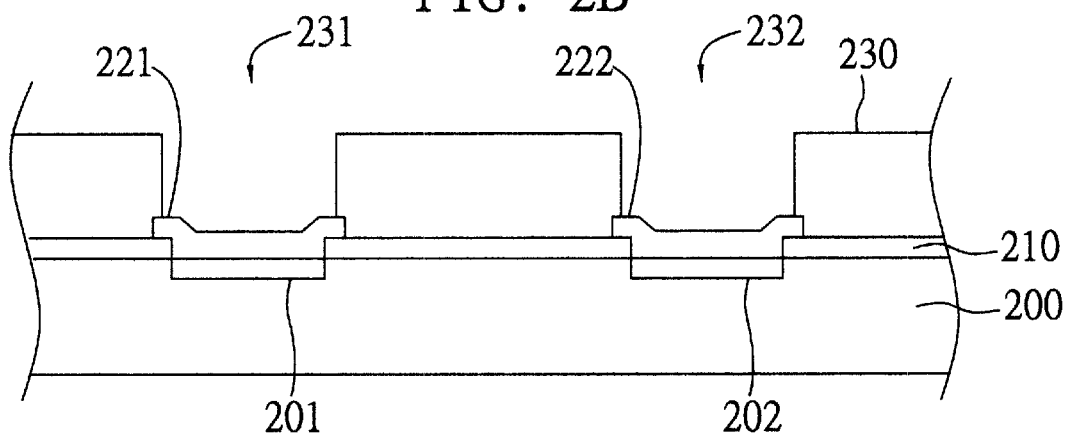

Referring next to FIG. 2B, in the first step of solder-bump fabrication, a mask, such as a dry-film mask 230, is disposed over the passivation layer 210. The dry-film mask 230 is predefined with a plurality of openings (only two are shown in FIG. 2B, respectively designated by the reference numerals 231, 232) to expose the UBM pads 221, 222.

Figure 2C:
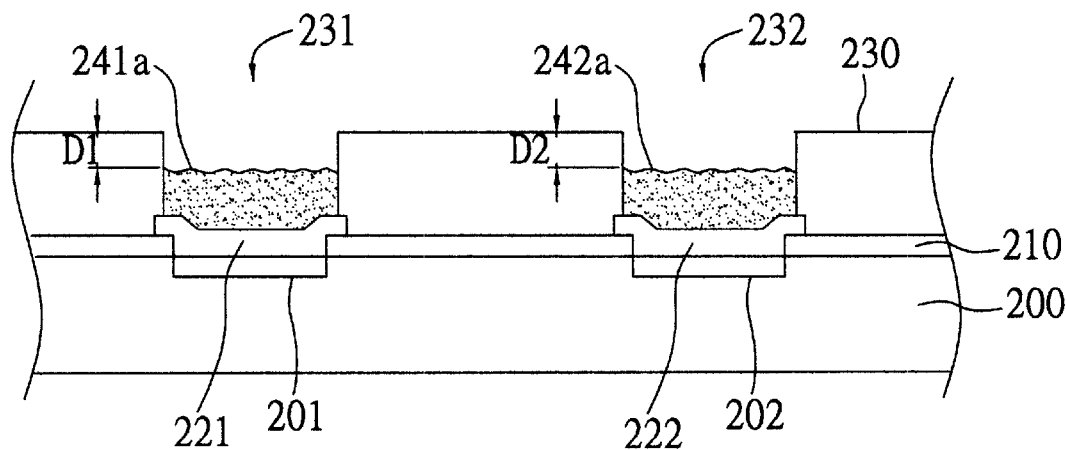

Referring further to FIG. 2C, in the next step, a solder-electroplating process is performed to electroplate a selected solder material, such as Sn/Pb (tin/lead) alloy, through the mask openings 231, 232 onto the UBM pads 221, 222.

Assume the first UBM pad 221 receives a lower electroplating electrical current, while the second UBM pad 222 receives a higher electroplating electrical current during the solder-electroplating process.

It is an important aspect of the invention that the solder-electroplating process is performed in such a manner as to be interrupted at the time the topmost surface of the electroplated solder over the UBM pads 221, 222 is near but still below the topmost surface of the dry-film mask 230. As a result of this process, a first electroplated solder layer 241a is formed over the UBM pad 221, whose topmost surface is below the topmost surface of the dry-film mask 230 by a depth of $D_1$; while a second electroplated solder layer 242a is formed over the second UBM pad 222, whose topmost surface is below the topmost surface of the dry-film mask 230 by a depth of $D_2$. Since the first UBM pad 221 receives a lower electroplating electrical current and the second UBM pad 222 receives a higher electroplating electrical current during the solder-electroplating process, the first electroplated solder layer 241a over the first UBM pad 221 would be lower in height than the second electroplated solder layer 242a over the second UBM pad 222 (i.e., $D_1 > D_2$). It is to be noted that $D_1$ and $D_2$ should be shallow enough to facilitate subsequent screen-printing process.

Figure 2D:
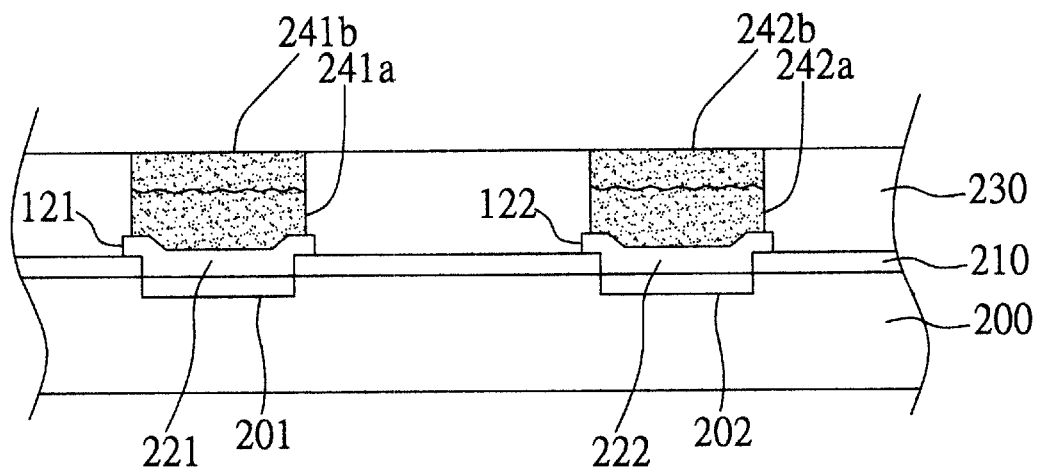

Referring further to FIG. 2D, in the step, a screen-printing process is performed to print solder paste into the remaining void portions of the mask openings 231, 232 that are unoccupied by the electroplated solder layers 241a, 242a. As a result of this process, a first printed solder layer 241b is formed over the first electroplated solder layer 241a, while a second printed solder layer 242b formed over the second electroplated solder layer 242a. Moreover, the screen-printing process allows the both the first and second printed solder layers 241b, 242b to be substantially formed with a flat top surface leveled with the topmost surface of the dry-film mask 230. This allows the combined volume of the first electroplated solder layer 241a and the first printed solder layer 241b to be substantially equal to the combined volume of the second electroplated solder layer 242a and the second printed solder layer 242b.

Figure 2E:
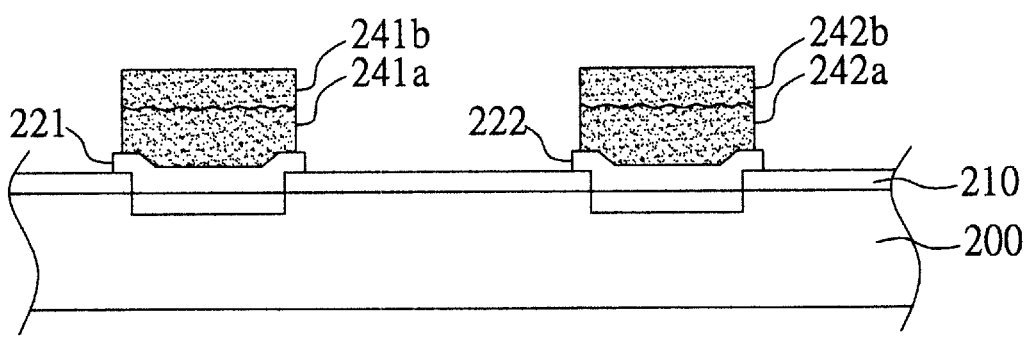

Referring further to FIG. 2E, in the next step, the dry-film mask 230 is entirely removed, leaving the combined structure of the first electroplated solder layer 241a and the first printed solder layer 241b over the first UBM pad 221, and the combined structure of the second electroplated solder layer 242a and the second printed solder layer 242b over the second UBM pad 222.

Figure 2F:
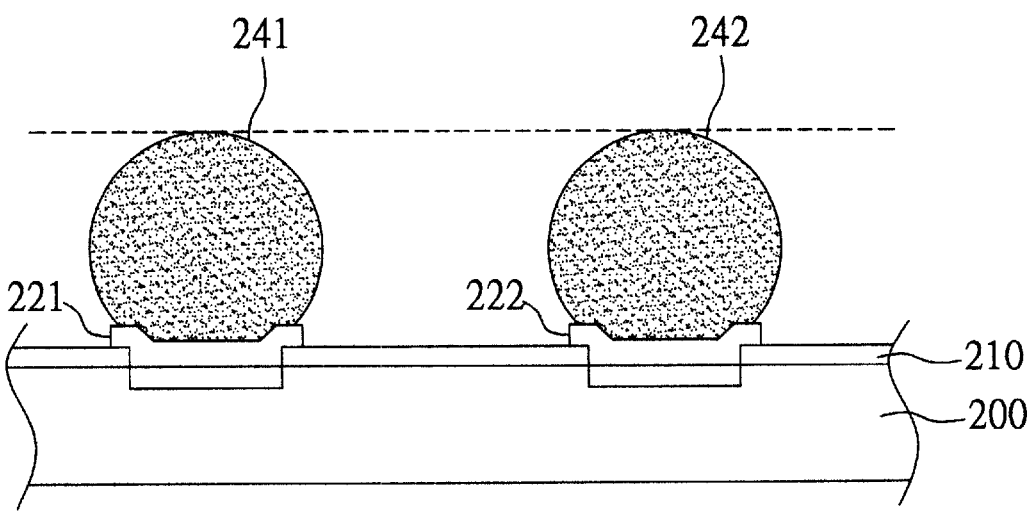

Referring further to FIG. 2F, in the next step, a solder-reflow process is performed to reflow the combined structure of the first electroplated solder layer 241a and the first printed solder layer 241b shown in FIG. 2E into a first solder bump 241 over the first UBM pad 221, and reflow the combined structure of the second electroplated solder layer 242a and the second printed solder layer 242b shown in FIG. 2E into a second solder bump 242 over the second UBM pad 222. This solder-reflow process includes two stages: a first stage to reflow the printed solder layers 241b, 242b; and a second stage to reflow the electroplated solder layer 241a, 242a. After reflow, the resulted solder bump 241, 242 are more rounded in shape and substantially coplanarized. This completes the solder-bump fabrication according to the invention.

In conclusion, the invention provides a new solder-bump fabrication method which is characterized in the use of a two-step solder-bump fabrication process, including a first step of electroplating solder over UBM pads to a controlled height still below the topmost surface of the dry-film mask, and a second step of screen-printing solder paste over the electroplated solder layer. Compared to the prior art, since the solder-bump fabrication method of the invention allows the solder material electroplated and printed over the UBM pads to be confined within the mask openings and never exceed the topmost surface of the mask, the resulted solder bumps would not be bridged to neighboring ones. Moreover, the solder-bump fabrication method of the invention allows all the resulted solder bumps to be substantially equally sized to achieve high coplanarity. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for solder-bump fabrication over a semiconductor chip, comprising the steps of:
    (1) forming an array of UBM pads over the semiconductor chip;
    (2) forming a mask over the semiconductor chip, the mask being predefined with a plurality of openings to expose the UBM pads;
    (3) performing a solder-electroplating process to electroplate a solder material through the mask openings onto the UBM pads until the topmost surface of the electroplated solder over the UBM pads reaches a predefined height below the topmost surface of the mask to thereby form an electroplated solder layer over each of the UBM pads; and
    (4) performing a screen-printing process to fill solder paste into the remaining void portions in each of the mask openings to thereby form a printed solder layer over each electroplated solder layer.

2. The method of claim 1, wherein in said step (2), the mask is a dry-film mask.

3. The method of claim 1, wherein in said step (3), the solder material being used is Sn/Pb alloy.

4. The method of claim 1, further comprising the steps of:
    (5) removing the mask; and
    (6) performing a solder-reflow process to reflow each combined structure of electroplated solder layer and printed solder layer into one single solder bump.

5. The method of claim 4, wherein in said step (6), the solder-reflow process includes a first stage of reflowing each printed solder layer; and a second stage of reflowing each electroplated solder layer.

6. A method for fabricating a plurality of solder bumps over a semiconductor chip, comprising the steps of:
    (1) forming an array of UBM pads over the semiconductor chip;
    (2) forming a mask over the semiconductor chip, the mask being predefined with a plurality of openings to expose the UBM pads;
    (3) performing a solder-electroplating process to electroplate a solder material through the mask openings onto the UBM pads until the topmost surface of the electroplated solder over the UBM pads reaches a predefined height below the topmost surface of the mask to thereby form an electroplated solder layer over each of the UBM pads;
    (4) performing a screen-printing process to fill solder paste into the remaining void portions in each of the mask openings to thereby form a printed solder layer over each electroplated solder layer;
    (5) removing the mask; and
    (6) performing a solder-reflow process to reflow each combined structure of electroplated solder layer and printed solder layer into one single solder bump.

7. The method of claim 6, wherein in said step (2), the mask is a dry-film mask.

8. The method of claim 6, wherein in said step (3), the solder material being used is Sn/Pb alloy.

9. The method of claim 6, wherein in said step (6), the solder-reflow process includes a first stage of reflowing each printed solder layer; and a second stage of reflowing each electroplated solder layer.

* * * * *